United States Patent
Park

(10) Patent No.: US 8,900,898 B2
(45) Date of Patent: Dec. 2, 2014

(54) ORGANIC LIGHT-EMITTING DISPLAY HAVING LIGHT BLOCKING LAYER FORMED OVER PIXEL DEFINING LAYER

(71) Applicant: Yong-Woo Park, Suwon-si (KR)

(72) Inventor: Yong-Woo Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 4 days.

(21) Appl. No.: 13/948,086

(22) Filed: Jul. 22, 2013

(65) Prior Publication Data

US 2013/0309793 A1    Nov. 21, 2013

Related U.S. Application Data

(62) Division of application No. 13/349,398, filed on Jan. 12, 2012, now Pat. No. 8,519,407.

(30) Foreign Application Priority Data

Feb. 18, 2011    (KR) .......................... 10-2011-0014717

(51) Int. Cl.
  *H01L 51/50*    (2006.01)
  *H01L 51/56*    (2006.01)
  *H01L 27/12*    (2006.01)
  *H01L 27/32*    (2006.01)
  *H01L 29/786*   (2006.01)

(52) U.S. Cl.
  CPC ............ *H01L 51/56* (2013.01); *H01L 27/1225* (2013.01); *H01L 27/3272* (2013.01); *H01L 29/78633* (2013.01); *H01L 27/3246* (2013.01)
  USPC .................. 438/29; 438/34; 438/99; 438/152

(58) Field of Classification Search
  CPC ............................. H01L 51/0512; H01L 51/50
  USPC ........................................ 438/29, 34, 99, 152
  See application file for complete search history.

(56) References Cited

U.S. PATENT DOCUMENTS 7,405,428 B2    7/2008  Yun
7,417,373 B2    8/2008  Yamazaki
(Continued)

FOREIGN PATENT DOCUMENTS

| KR | 10-2006-0000745 A | 1/2006 |
| KR | 10-2006-0060462 A | 6/2006 |
| KR | 10-2008-0077815 A | 8/2008 |
| KR | 10-0911993 B1     | 8/2009 |

OTHER PUBLICATIONS

Office Action Dated Jan. 23, 2013 for U.S. Appl. No. 13/349,398.

*Primary Examiner* — Michael Trinh
*Assistant Examiner* — Toniae Thomas
(74) *Attorney, Agent, or Firm* — Knobbe, Martens, Olson & Bear LLP

(57) ABSTRACT

An organic light-emitting display includes a substrate including a pixel region and a transistor region; a first transparent electrode and a second transparent electrode formed over the pixel region and the transistor region of the substrate, respectively; a gate electrode formed over the second transparent electrode; a gate insulating film formed over the gate electrode; a semiconductor layer formed over the gate insulating film; a source and drain electrode having an end connected to the semiconductor layer and the other end connected to the first transparent electrode; a pixel defining layer disposed over the source and drain electrode to cover the source and drain electrode and having an opening disposed over the first transparent electrode; a light-blocking layer formed over the pixel defining layer; and an organic light-emitting layer formed over the first transparent electrode.

21 Claims, 6 Drawing Sheets

(56) References Cited

U.S. PATENT DOCUMENTS

| | | |
|---|---|---|
| 7,459,351 B2 | 12/2008 | Chen |
| 7,486,360 B2 | 2/2009 | Kim |
| 7,560,316 B2 | 7/2009 | Heo et al. |
| 7,646,455 B2 | 1/2010 | Rho |
| 7,777,698 B2 | 8/2010 | Takahara et al. |
| 7,800,100 B2 | 9/2010 | Lee et al. |
| 8,174,021 B2 | 5/2012 | Oikawa et al. |
| 8,237,156 B2 | 8/2012 | Kang |
| 8,519,407 B2 | 8/2013 | Park |
| 2002/0180369 A1 | 12/2002 | Koyama |
| 2005/0195353 A1 | 9/2005 | Park et al. |
| 2007/0024774 A1 | 2/2007 | Cho et al. |
| 2007/0085947 A1 | 4/2007 | Yoon et al. |
| 2007/0109467 A1 | 5/2007 | Chang et al. |
| 2007/0158729 A1 | 7/2007 | Yang et al. |
| 2007/0181881 A1 | 8/2007 | Koh et al. |
| 2007/0194318 A1 | 8/2007 | Jung et al. |
| 2008/0100209 A1 | 5/2008 | Ito |
| 2009/0066237 A1 | 3/2009 | Kambe et al. |
| 2009/0261713 A1 | 10/2009 | Choi et al. |
| 2010/0117980 A1 | 5/2010 | Lee et al. |
| 2010/0134734 A1 | 6/2010 | Kim et al. |
| 2010/0163868 A1 | 7/2010 | Yamazaki et al. |
| 2012/0049184 A1 | 3/2012 | Umezaki et al. |

US 8,900,898 B2

ORGANIC LIGHT-EMITTING DISPLAY HAVING LIGHT BLOCKING LAYER FORMED OVER PIXEL DEFINING LAYER

This application is a divisional of U.S. patent application Ser. No. 13/349,398, filed Jan. 12, 2012, which claims priority to Korean Patent Application No. 10-2011-0014717 filed on Feb. 18, 2011 in the Korean Intellectual Property Office. The disclosures of the U.S. patent application Ser. No. 13/349,398 and the Korean Patent Application No. 10-2011-0014717 are incorporated herein by reference in their entirety.

BACKGROUND

1. Field

The present disclosure relates to an organic light-emitting display and a method of manufacturing the same, and more particularly, to reducing deterioration of organic light-emitting displays caused by light.

2. Description of the Related Technology

Generally, in an active matrix organic light-emitting diode (AMOLED) panel, light is generated by supplying currents to an organic light-emitting diode (OLED) which is a self-luminous device.

For example, in an organic light-emitting display using an OLED, a gate electrode, a semiconductor layer, and a source and drain electrode are sequentially formed on a substrate, and a pixel defining layer is formed to cover the resultant structure. If the organic light-emitting display is of a bottom emission type, light emitted from the OLED of a pixel region exits the organic light-emitting display via the substrate.

However, when the OLED continuously emits light for a certain period of time, even if the same current is supplied to the OLED, the amount of light that the OLED emits decreases over time, or the number of malfunctions increases over time. As a result, the reliability of the OLED is undermined.

Such a problem occurs particularly when an oxide semiconductor sensitive to moisture and heat is used in the organic light-emitting display because the oxide semiconductor is degraded by light emitted from the OLED and thus its optical reliability is deteriorated.

Therefore, it is required to minimize reliability deterioration of the oxide semiconductor resulting from the degradation of the oxide semiconductor by light emitted from the OLED.

SUMMARY OF CERTAIN INVENTIVE ASPECTS

Aspects of the present invention provide an organic light-emitting display and a method of manufacturing the same, in which degradation of an oxide semiconductor layer by light is minimized to improve the elemental reliability of the oxide semiconductor layer.

Aspects of the present invention also provide an organic light-emitting display and a method of manufacturing the same, in which a light-blocking layer having a light-blocking effect is further formed over a pixel defining layer to improve the elemental reliability of an oxide semiconductor layer.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display comprising: a substrate comprising a pixel region and a transistor region; a first transparent electrode and a second transparent electrode formed over the pixel region and the transistor region of the substrate, respectively; a gate electrode formed over the second transparent electrode; a gate insulating film formed over the gate electrode; a semiconductor layer formed over the gate insulating film; a source and drain electrode comprising an end connected to the semiconductor layer and the other end connected to the first transparent electrode; a pixel defining layer disposed over the source and drain electrode to cover the source and drain electrode and comprising an opening disposed over the first transparent electrode; a light-blocking layer formed over the pixel defining layer; and an organic light-emitting layer formed over the first transparent electrode.

According to another aspect of the present invention, there is provided an organic light-emitting display comprising: a substrate comprising a pixel region and a transistor region; a first transparent electrode and a second transparent electrode formed over the pixel region and the transistor region of the substrate, respectively; a gate electrode formed over the second transparent electrode; a gate insulating film formed over the gate electrode; a semiconductor layer formed over the gate insulating film; a source and drain electrode comprising an end connected to the semiconductor layer and the other end connected to the first transparent electrode; a first pixel defining layer disposed over the source and drain electrode to cover the source and drain electrode and comprising an opening disposed the first transparent electrode; a light-blocking layer formed over the first pixel defining layer; a second pixel defining layer formed over the first pixel defining layer and the light-blocking layer, wherein the light-blocking layer is interposed between the first and second pixel defining layers; and an organic light-emitting layer formed over the first transparent electrode, wherein the light-blocking layer comprises an opening disposed over the first transparent electrode, wherein the boundary of the opening of the light-blocking layer is situated further away from the center of the opening of the first pixel defining layer than the boundary of the opening of the first pixel defining layer.

According to another aspect of the present invention, there is provided a method of manufacturing an organic light-emitting display, the method comprising: forming a first transparent electrode and a second transparent electrode over a pixel region and a transistor region of a substrate, respectively; forming a gate electrode over the second transparent electrode; forming a semiconductor layer over the transistor region; forming a source and drain electrode, which comprises an end connected to the semiconductor layer and the other end connected to the first transparent electrode, over the semiconductor layer; forming a pixel defining layer over the source and drain electrode to cover the source and drain electrode; forming an open portion, which exposes the first transparent electrode of the pixel region, in the pixel defining layer; forming a light-blocking layer over the pixel defining layer; and forming an organic light-emitting layer over the first transparent electrode.

According to another aspect of the present invention, there is provided a method of manufacturing an organic light-emitting display, the method comprising: forming a first transparent electrode and a second transparent electrode over a pixel region and a transistor region of a substrate, respectively; forming a gate electrode over the second transparent electrode; forming a semiconductor layer over the transistor region; forming a source and drain electrode, which comprises an end connected to the semiconductor layer and the other end connected to the first transparent electrode, over the semiconductor layer; forming a first pixel defining layer over the source and drain electrode to cover the source and drain electrode; forming an open portion, which exposes the first transparent electrode of the pixel region, in the first pixel defining layer; forming a light-blocking layer over the first pixel defining layer; forming a second pixel defining layer over the first pixel defining layer and the light-blocking layer wherein the light-blocking layer is interposed between the first and second pixel defining layers; and forming an organic light-emitting layer over the first transparent electrode, wherein the light-blocking layer comprises an opening disposed over the first transparent electrode, wherein the boundary of the opening of the light-blocking layer is situated further away from the center of the opening of the first pixel defining layer than the boundary of the opening of the first pixel defining layer.

BRIEF DESCRIPTION OF THE DRAWINGS

The above and other aspects and features of the present invention will become more apparent by describing in detail embodiments thereof with reference to the attached drawings, in which.

DETAILED DESCRIPTION OF CERTAIN INVENTIVE EMBODIMENTS

Figure 1:
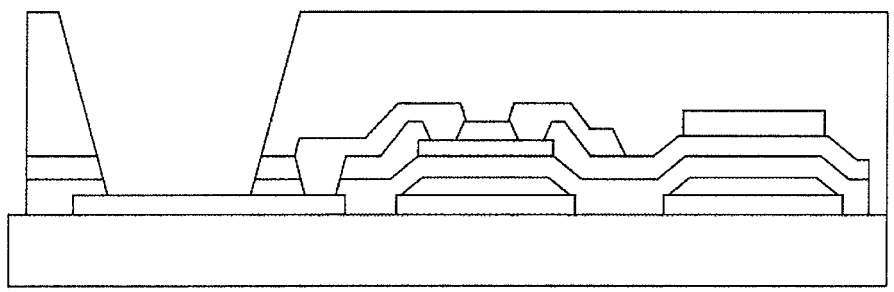
FIG. 1 is a schematic cross-sectional view of an example of an organic light-emitting display.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Figure 2:
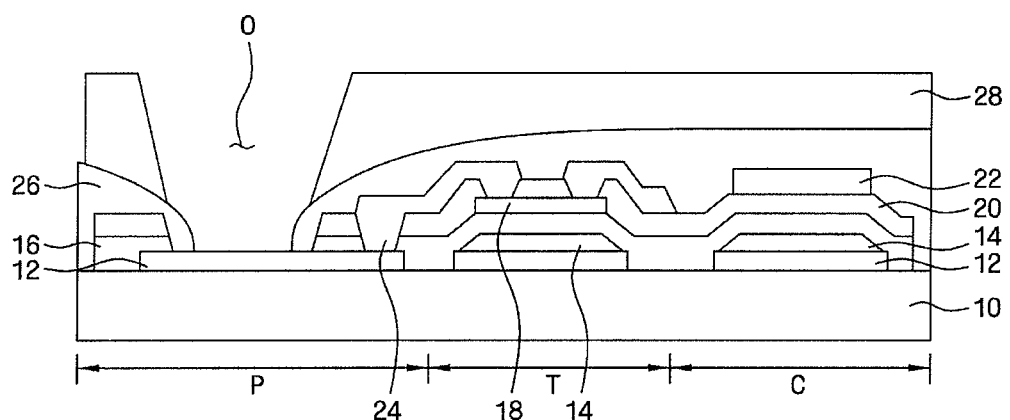
FIG. 2 is a schematic cross-sectional view of an organic light-emitting display according to an embodiment of the present invention.

Hereinafter, an organic light-emitting display according to an embodiment of the present invention will be described with reference to FIG. 2. FIG. 2 is a schematic cross-sectional view of an organic light-emitting display according to an embodiment of the present invention.

The organic light-emitting display according to the current embodiment includes a substrate 10 having a pixel region P, a transistor region T and a capacitor region C, a transparent electrode 12 formed on each of the pixel region P, the transistor region T and the capacitor region C of the substrate 10, a gate electrode 14 formed on the transparent electrode 12, a gate insulating film 16 formed on the gate electrode 14, a semiconductor layer 18 formed on the gate insulating film 16 of the transistor region T, a source and drain electrode 24 having an end connected to the semiconductor layer 18 and the other end connected to the transparent electrode 12 of the pixel region P, a pixel defining layer 26 disposed on the source and drain electrode 24 to cover the source and drain electrode 24 and having an open portion O which exposes the transparent electrode 12 of the pixel region P to define the pixel region P, a light-blocking layer 28 formed on the pixel defining layer 26 in the same pattern as the pixel defining layer 26, and an organic light-emitting layer formed on the transparent electrode 12 of the pixel region P.

The substrate 10 may be made of a transparent glass material containing SiO2 as a main component. However, the material that forms the substrate 10 is not limited to the transparent glass material. The substrate 10 may also be made of a transparent plastic material. If the organic light-emitting display according to the current embodiment is a bottom emission organic light-emitting display, light emitted from the organic light-emitting layer exits the organic light-emitting display through the substrate 10. Therefore, the substrate 10 should be made of a transparent material in order to not block the light. However, if the organic light-emitting display according to the current embodiment is a top emission organic light-emitting display, the substrate 10 may not necessarily be made of a transparent material.

The plastic material that forms the substrate 10 may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

The substrate 10 included in the organic light-emitting display according to the current embodiment may be partitioned into the pixel region P, the transistor region T, and the capacitor region C. The pixel region P is a region on which the organic light-emitting layer is formed to emit light, and the transistor region T controls a voltage flowing to the pixel region P. In addition, the capacitor region C enables a voltage to remain constant without dropping between frame signals.

A buffer layer (not shown) may further be formed on the substrate 10 to planarize the substrate 10 and prevent penetration of impurities into the substrate 10. The buffer layer may be a single layer of SiOx, SiNx or SiO2Nx, or a multilayer of these materials. The buffer layer may be formed by chemical vapor deposition (CVD) or physical vapor deposition (PVD).

The transparent electrode 12 is formed on each of the pixel region P, the transistor region T and the capacitor region C of the substrate 10. If the organic light-emitting display according to the current embodiment is a bottom emission organic light-emitting display, since light exits the organic light-emitting display via the transparent electrode 12 and the substrate 10, the transparent electrode 12 may be made of a transparent material, i.e., a transparent conductive material. The transparent conductive material may be a mixture of one or more materials selected from indium tin oxide (ITO), indium zinc oxide (IZO), carbon nanotubes, a conductive polymer, and nanowires.

A voltage applied to the source and drain electrode 24 by the semiconductor layer 18 is delivered to the transparent electrode 12 of the pixel region P, causing the organic light-emitting layer disposed on the transparent electrode 12 to emit light by itself.

The gate electrode 14 may be formed on the transparent electrode 12 of each of the transistor region T and the capacitor region C. A gate voltage is applied to the gate electrode 14, and the gate electrode 14 may be a single layer of Al or an Al alloy, such as Al—Nd, or a multilayer of a Cr or Mo alloy and an Al alloy stacked on the Cr or Mo alloy.

The gate insulating film 16 is disposed on the gate electrode 14. Like the buffer layer described above, the gate insulating film 16 may be a single layer of $SiO_2$, $SiN_X$ or SiO2Nx, or a multilayer of these materials. The gate insulating film 16 may be made of the same material as the buffer layer or a different material from that of the buffer layer.

As will be described later, the gate insulating film 16 is coated on the entire surface of the substrate 10, and the open portion O exposing the transparent electrode 12 of the pixel region P is formed on a portion of the pixel region P on which the organic light-emitting layer is provided.

The semiconductor layer 18 is provided on the gate insulating film 16 of the transistor region T. The semiconductor layer 18 may control a current supplied to the transparent electrode 12 of the pixel region P by selectively supplying a current to the source and drain electrode 24.

The semiconductor layer 18 may be made of silicon (Si), i.e., amorphous silicon (a-Si). Alternatively, the semiconductor layer 18 may be made of polycrystalline silicon (p-Si), depending on the amount of current required. Otherwise, the semiconductor layer 18 may be made of, but is not limited to, Ge, GaP, GaAs, or AlAs.

In particular, the semiconductor layer 18 according to the current embodiment may be an oxide semiconductor layer made of an oxide. For example, the semiconductor layer 18 may contain an oxide of a material selected from Zn, In, Ga, Sn, Hf, and a combination of the same. That is, the semiconductor layer 18 may be made of a mixed oxide selected from ZnO, InZnO, InGaO, InSnO, ZnSnO, GaSnO, GaZnO, GaZnSnO, and GaInZnO. The oxide semiconductor layer 18 has 2 to 100 times greater effective charge mobility than amorphous silicon and has an on/off current ratio of $10^5$ to $10^8$. Thus, the oxide semiconductor layer 18 shows excellent semiconductor properties.

Furthermore, since the oxide semiconductor layer 18 has a band gap of approximately 3.0 eV to approximately 3.5 eV, leakage photoelectric current with respect to visible light is not generated. Accordingly, an instantaneous afterimage of an oxide thin-film transistor may be prevented, making it unnecessary to form a light blocking layer under the oxide thin-film transistor.

In order to enhance properties of the oxide semiconductor layer 18, a Group 3, Group 4, Group 5, or transition element from the periodic table may be additionally included. Furthermore, although the majority of the oxide semiconductor layer 18 is an amorphous state, the oxide semiconductor layer 18 has high effective charge mobility, and existing manufacturing processes for amorphous silicon may be used without any change, such that application to large display devices is possible.

The semiconductor layer 18 can be degraded by light emitted from the organic light-emitting layer. Therefore, as will be described later, the light-blocking layer 28 may further be formed on the pixel defining layer 26 in the organic light-emitting display according to the current embodiment. The light-blocking layer 28 can reduce or minimize the degradation of the semiconductor layer 18 caused by light emitted from the organic light-emitting layer and improve the elemental reliability of the oxide semiconductor layer 18.

An additional insulating film 20 may be provided on the semiconductor layer 18.

The source and drain electrode 24 is formed on the semiconductor layer 18. An end of the source and drain electrode 24 is in contact with the semiconductor layer 18 through a contact hole formed in the insulating film 20, and the other end of the source and drain electrode 24 is connected to the transparent electrode 12 of the pixel region P by a contact hole. As described above, when the semiconductor layer 18 becomes a conductor, the source and drain electrode 24 applies a driving voltage to the transparent electrode 12 of the pixel region P.

The source and drain electrode 24 may be made of any one material selected from Mo, Cr, W, MoW, Al, Al—Nd, Ti, TiN, Cu, a Mo alloy, an Al alloy, and a Cu alloy.

The pixel defining layer 26 is formed on the source and drain electrode 24 to cover the source and drain electrode 24 and protect the internal components. The open portion or opening O exposing a central portion of the transparent electrode 24 of the pixel region P or the entire portion of the transparent electrode 24 is formed in the pixel defining layer 26 to define a pixel on the pixel region P.

The pixel defining layer 26 may be made of one or more organic materials selected from a photosensitive polyimide (PSPI) material, an acrylic material, a siloxane material and a novolac material, or an inorganic material such as SiOx or SiNx.

Unlike in a conventional organic light-emitting display shown in FIG. 1, in the organic light-emitting display according to the current embodiment, the light-blocking layer 28 having the open portion O is disposed on the pixel defining layer 26. The light-blocking layer 28 is formed at the same location as the pixel defining layer 26.

As described above, the semiconductor layer 18, particularly when made of an oxide, may be degraded by the organic light-emitting layer. Accordingly, the elemental reliability of the semiconductor layer 18 may deteriorate, and the quality of the semiconductor layer 18 may be adversely affected. For this reason, in the organic light-emitting display according to the current embodiment, the light-blocking layer 28 is further formed on the pixel defining layer 26 to block light transmitted from the outside or light emitted by the organic light-emitting layer, thereby minimize or reduce the degradation of the semiconductor layer 18.

The light-blocking layer 28 according to the current embodiment may be made of the same or different material as the pixel defining layer 26. However, the material that forms the light-blocking layer 28 should satisfy properties of the pixel defining layer 26, such as dielectric, heat resistant and chemical resistant properties. That is, if the light-blocking layer 28 formed on the pixel defining layer 26 has a higher dielectric constant than the pixel defining layer 26, it may affect electrical properties of the organic light-emitting layer, thus causing defects.

Therefore, the light-blocking layer 28 according to the current embodiment may be made of a material with a dielectric constant of about 3.0 or less. In this case, the light-blocking layer 28 may not affect the electrical properties of the adjacent organic light-emitting layer, thus reducing defects. The light-blocking layer 28 may also be made of a heat resistant material that is resistant to outgassing. In addition, the light-blocking layer 28 may be made of a chemical resistant material that is unaffected by chemicals used in manufacturing processes, such as an etching solution.

The light-blocking layer 28 may be made of a colored material to protect the semiconductor layer 18 by effectively blocking light. That is, since the colored material mostly reflects light in a corresponding wavelength range, it gives the light-blocking layer 28 the ability to selectively block light. For example, the light-blocking layer 28 may be made of a blue material (400 nm) having an excellent light-blocking effect so as to block light in a corresponding wavelength range of about 350 nm to about 450 nm. Alternatively, the light-blocking layer 28 may be made of dye or pigment of various colors.

A material of a color having low brightness, that is, a material of a color close to black has an excellent light-blocking effect. Therefore, the light-blocking layer 28 may be made of a material having low brightness in a Munsell color system. In particular, a material having a brightness of about 3 or less shows an excellent light-blocking effect.

As described above, in the organic light-emitting display according to the current embodiment, the light-blocking layer 28 is further formed on the pixel defining layer 26. The light-blocking effect provided by the light-blocking layer 28 minimize the degradation of the semiconductor layer 18 and a resulting reduction in the reliability of the semiconductor layer 18.

The organic light-emitting layer (not shown) which emits light by itself when supplied with a current is formed on the transparent electrode 12 of the pixel region P. To minimize the effect that the light-blocking layer 28 has on the organic light-emitting layer when directly contacting the organic light-emitting layer, ends of the light-blocking layer 28 may be situated further away from the center of the open portion O than those of the pixel defining layer 26, as shown in FIG. 2. That is, the pixel defining layer 26 may protrude further toward the center of the open portion O than the light-blocking layer 28 to form the open portion O having a relatively smaller diameter. Therefore, the organic light-emitting layer provided on the transparent electrode 12 of the pixel region P is separated from the light-blocking layer 28 so that it does not directly contact the light-blocking layer 28.

Hereinafter, a method of manufacturing an organic light-emitting display according to an embodiment of the present invention will be described with reference to FIGS. 3 through 10. FIGS. 3 through 9 are cross-sectional views sequentially illustrating a method of manufacturing an organic light-emitting display according to an embodiment of the present invention. FIG. 10 is a flowchart illustrating a process of forming a pixel defining layer and a light-blocking layer in an organic light-emitting display according to an embodiment of the present invention.

Figure 3:
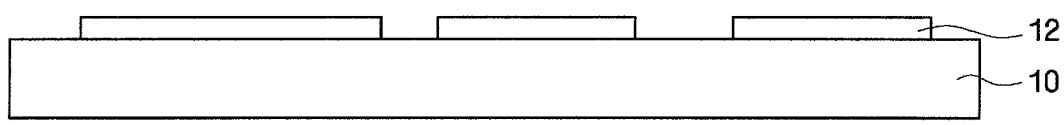
FIGS. 3 through 9 are cross-sectional views sequentially illustrating a method of manufacturing an organic light-emitting display according to an embodiment of the present invention.

Referring to FIG. 3, transparent electrodes 12 are formed on a substrate 10. As described above, the substrate 10 can be partitioned into a pixel region P, a transistor region T and a capacitor region C. Different components are stacked on each of the pixel region P, the transistor region T and the capacitor region C of the substrate 10, thereby forming a pixel unit, a transistor unit, and a capacitor unit.

Figure 4:
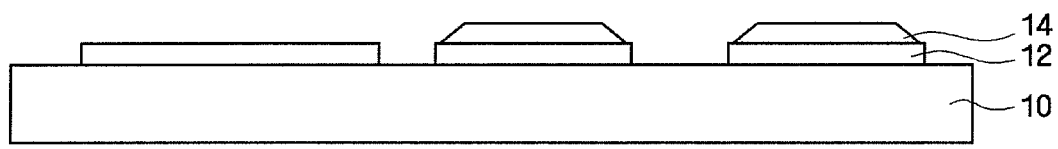

Referring to FIG. 4, gate electrodes 14 are formed on the transistor region T and the capacitor region C. The gate electrode 14 of the transistor region T receives a gate voltage to control the driving of a transistor. The gate electrode 14 of the capacitor region C enables a voltage of the transistor to remain constant without a drop while the gate voltage is applied.

Figure 5:
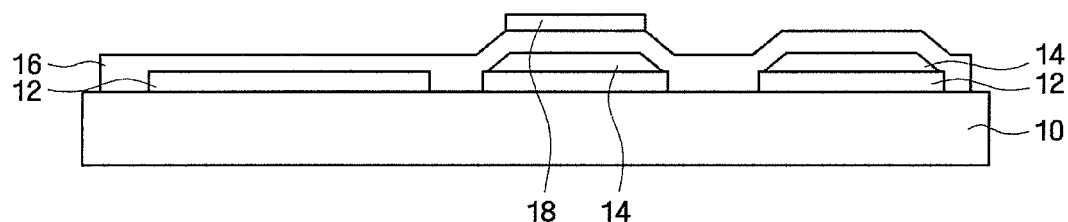

Referring to FIG. 5, a gate insulating film 16 is provided on the entire region of the substrate 10 to protect the gate electrodes 14, and a semiconductor layer 18 is formed on the gate insulating film 16 of the transistor region T. As described above, the semiconductor layer 18 may be made of an oxide selected from ZnO, InZnO, InGaO, InSnO, ZnSnO, GaSnO, GaZnO, GaZnSnO, and GaInZnO.

Figure 6:
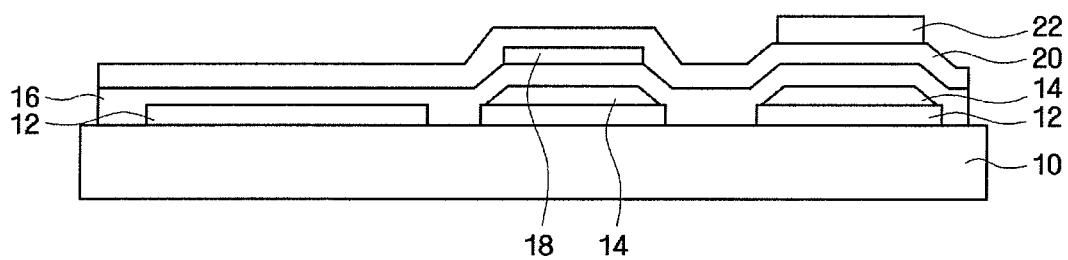

Referring to FIG. 6, an insulating film 20 for protecting the semiconductor layer 18 is formed above the substrate 10, and a facing electrode 22 facing the above-described gate electrode 14 of the capacitor region C is formed above the capacitor region C to maintain a constant voltage.

Figure 7:
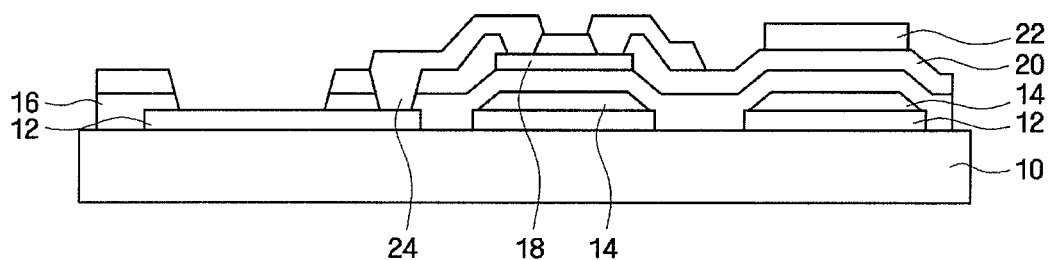

Referring to FIG. 7, an open portion O is formed to expose the transparent electrode 12 of the pixel region P. To form the open portion O, a conventional patterning process such as a wet-etching process or a dry-etching process may be used. Next, a source and drain electrode 24 is formed such that a first end of the source and drain electrode 24 is connected to the semiconductor layer 18 of the transistor region T by a contact hole and a second end of the source and drain electrode 24 is connected to the transparent electrode 12 of the pixel region P by a contact hole. The second end of the source and drain electrode 24 is connected to an end of the transparent electrode 12 of the pixel region P and does not overlap the open portion O. Thus, the second end of the source and drain electrode 24 does not affect the pixel unit.

Figure 8:
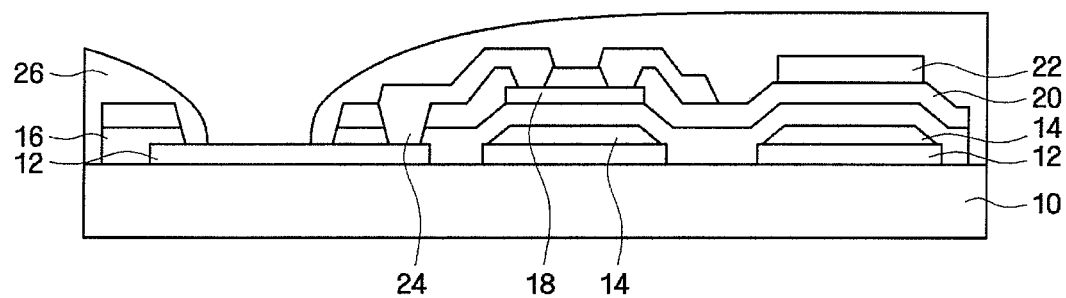

Referring to FIG. 8, a pixel defining layer 26 is provided on the substrate 10. As described above, the pixel defining layer 26 is formed on the entire region of the substrate 10, excluding the open portion O which exposes part or all the transparent electrode 12 of the pixel region P. Thus, the pixel defining layer 26 protects the internal components. In FIG. 8, the pixel defining layer 26 has a tapered edge which is rounded gradually from the capacitor region C toward the pixel region P. However, the present invention is not limited thereto. The pixel defining layer 26 can have any shape as long as its open portion O has a smaller diameter than that of a light-blocking layer 28.

Figure 9:
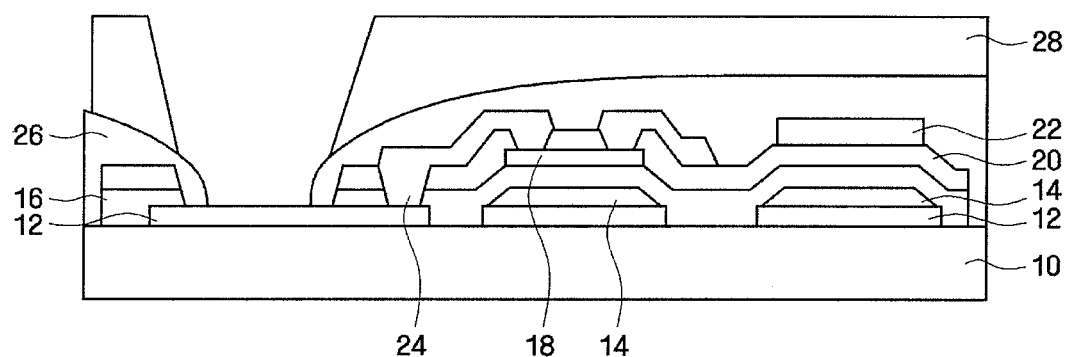
Figure 10:
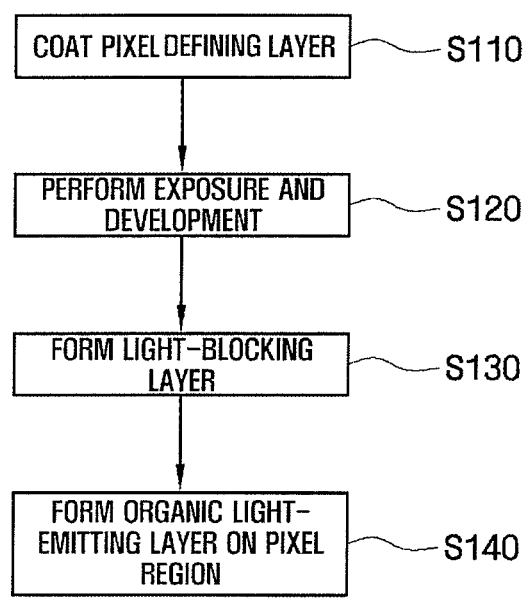
FIG. 10 is a flowchart illustrating a process of forming a pixel defining layer and a light-blocking layer in an organic light-emitting display according to an embodiment of the present invention.

Referring to FIG. 9, the light-blocking layer 28 is formed on the pixel defining layer 26. The light-blocking layer 28 is situated further back than the pixel defining layer 26 in order to not directly contact an organic light-emitting layer. The light-blocking layer 28 may be made of the same material as the pixel defining layer 26. However, the light-blocking layer 28 may be colored with dyes or pigments to be able to block light.

Referring to FIG. 10, the process of forming the pixel defining layer 26 and the light-blocking layer 28 is sequentially specified. That is, a material for forming the pixel defining layer 26 is coated on the entire surface of the substrate 10 (operation S110). Then, the coated material is solidified by a soft-bake process to form the solid pixel defining layer 26.

Next, a conventional photolithography process using photoresist may be performed to form the open portion O which exposes the transparent electrode 12 of the pixel region P. If the pixel defining layer 26 is made of a photosensitive material, it may be directly exposed to light without using photoresist and then developed, thereby forming the open portion O (operation S120). After the development process, a hard-bake process may further be performed.

Next, the light-blocking layer 28 is formed on the pixel defining layer 26 (operation S130). Specifically, a material colored with dyes or pigments may be coated on the pixel defining layer 26 and then patterned in the same way as described above. Instead of forming the light-blocking layer 28 by performing exposure and development processes after the coating process, dyes or pigments having a light-blocking effect may be inkjet-printed on the pixel defining layer 26 to form the patterned light-blocking layer 28 on the pixel defining layer 26. If the light-blocking layer 28 is formed using such a printing technique, the problem of residues of, e.g., a coloring agent can be solved.

Next, the organic light-emitting layer is formed in the open portion O formed by the above patterning process (operation S140).

Figure 11:
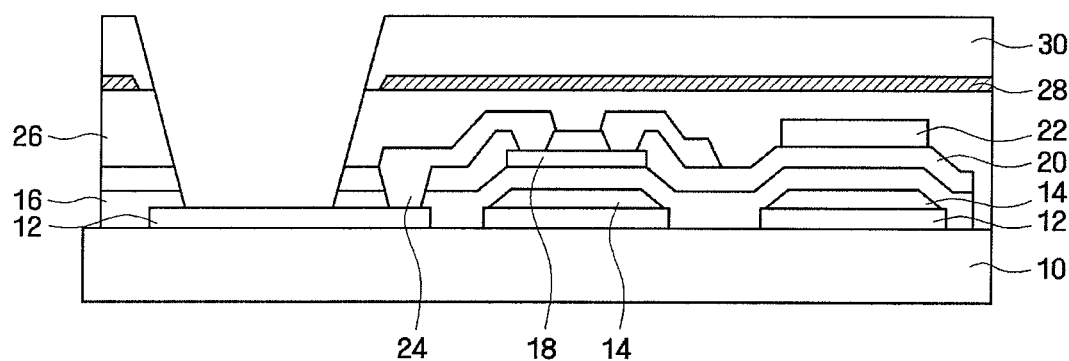
FIG. 11 is a schematic cross-sectional view of an organic light-emitting display according to another embodiment of the present invention.

Hereinafter, an organic light-emitting display according to another embodiment of the present invention will be described with reference to FIG. 11. FIG. 11 is a schematic cross-sectional view of an organic light-emitting display according to another embodiment of the present invention.

The organic light-emitting display according to the current embodiment includes a substrate 10 having a pixel region P and a transistor region T, a transparent electrode 12 formed on each of the pixel region P and the transistor region T of the substrate 10, a gate electrode 14 formed on the transparent electrode 12 of the transistor region T, a gate insulating film 16 formed on the gate electrode 14, a semiconductor layer 18 formed on the gate insulating film 16 of the transistor region T, a source and drain electrode 24 having an end connected to the semiconductor layer 18 and the other end connected to the transparent electrode 12 of the pixel region P, a first pixel defining layer 26 disposed on the source and drain electrode 24 to cover the source and drain electrode 24 and having an open portion O which exposes the transparent electrode 12 of the pixel region P to define the pixel region P, a light-blocking layer 28 formed on the first pixel defining layer 26 in the same pattern as the first pixel defining layer 26, a second pixel defining layer 30 formed on the first pixel defining layer 26 and the light-blocking layer 28, and an organic light-emitting layer formed on the transparent electrode 12 of the pixel region P. Ends of the light-blocking layer 28 are situated further away from the center of the open portion O than those of the first and second pixel defining layers 26 and 30.

The basic configuration of the organic light-emitting display according to the current embodiment is the same as that of the organic light-emitting display according to the previous embodiment, and thus any repetitive description thereof is omitted. However, the organic light-emitting display according to the current embodiment further includes the second pixel defining layer 30 on the light-blocking layer 28, in addition to the components of the organic light-emitting display according to the previous embodiment.

The first pixel defining layer 26 and the second pixel defining layer 30 may be made of the same material. As described above, the first pixel defining layer 26 and the second pixel defining layer 30 may be made of one or more materials selected from a photosensitive polyimide material, an acrylic material, a siloxane material and a novolac material, or an inorganic material such as SiOX or SiNx.

The light-blocking layer 28 is interposed between the first and second pixel defining layers 26 and 30. The material that forms the light-blocking layer 28 is as described above. The ends of the light-blocking layer 28 are situated further away from the center of the open portion O than those of the first and second pixel defining layers 26 and 30. Therefore, the light-blocking layer 28 does not directly contact the organic light-emitting layer disposed on the transparent electrode 12 of the pixel region P.

Figure 12:
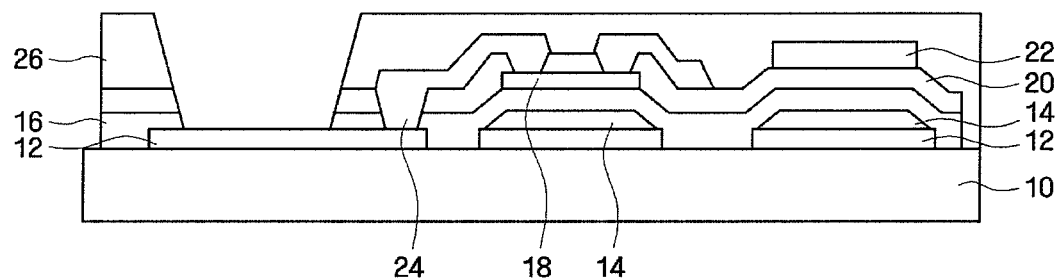
FIGS. 12 through 14 are cross-sectional views sequentially illustrating a method of manufacturing an organic light-emitting display according to another embodiment of the present invention.
Figure 13:
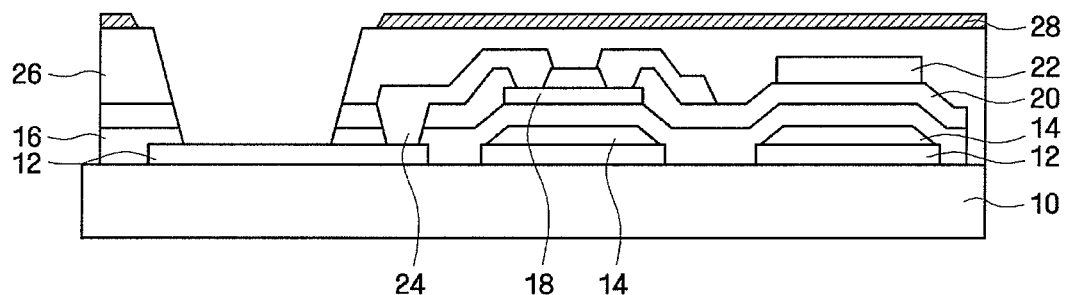
Figure 14:
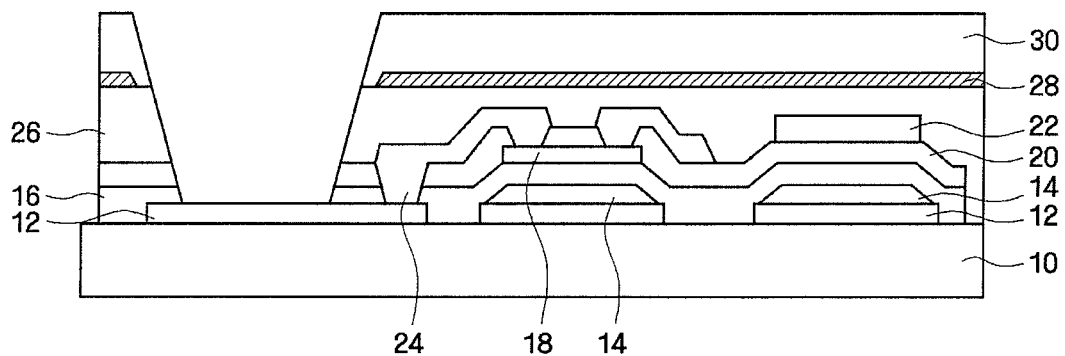
Figure 15:
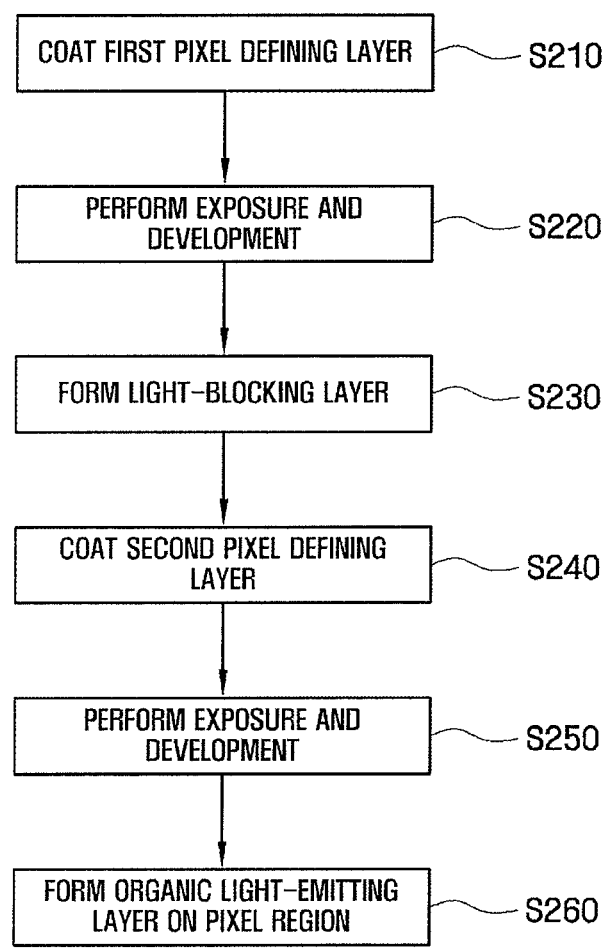
FIG. 15 is a flowchart illustrating a process of forming first and second pixel defining layers and a light-blocking layer in an organic light-emitting display according to another embodiment of the present invention.

Hereinafter, a method of manufacturing an organic light-emitting display according to another embodiment of the present invention will be described with reference to FIGS. 12 through 15. FIGS. 12 through 14 are cross-sectional views sequentially illustrating a method of manufacturing an organic light-emitting display according to another embodiment of the present invention. FIG. 15 is a flowchart illustrating a process of forming first and second pixel defining layers and a light-blocking layer in an organic light-emitting display according to another embodiment of the present invention.

Referring to FIG. 12, a first pixel defied layer 26 is formed on a source and drain electrode 24. Since previous processes are identical to those of the previous embodiment, a repetitive description thereof is omitted. Unlike in the previous embodiment, a double pixel defining layer is formed in the current embodiment. Therefore, each of the first and second pixel defining layers 26 and 30 may be thinner than the pixel defining layer 26 according to the previous embodiment.

Referring to FIG. 13, a light-blocking layer 28 is further formed on the first pixel defining layer 26. Since a double pixel defining layer is formed in the current embodiment, the light-blocking layer 28 may also be formed thinner than the light-blocking layer 28 according to the previous embodiment in order to prevent the organic light-emitting display from becoming excessively thick. To maximize the light-blocking effect, the light-blocking layer 28 may be made of a black material with a dielectric constant of about 3.0 or less and excellent heat resistant and chemical resistant properties. As described above, the light-blocking layer 28 is situated further away from an open portion O than the first pixel defining layer 26 by a predetermined distance. Accordingly, the light-blocking layer 28 does not directly contact an organic light-emitting layer and thus does not deteriorate electrical properties of the organic light-emitting layer.

Referring to FIG. 14, the second pixel defining layer 30 is formed on the light-blocking layer 28. Like the first pixel defining layer 26, the second pixel defining layer 30 protrudes further toward the open portion O than the light-blocking layer 28 thereunder, thereby preventing the light-blocking layer 28 from being exposed in the open portion O.

Referring to FIG. 15, the first pixel defining layer 26 is coated (operation S210) and then exposed to light and developed to form the open portion O (operation S220). Then, the light-blocking layer 28 is formed on the first pixel defining layer 26 (operation S230). As described above, the light-blocking layer 28 may be coated on the surface of the first pixel defining layer 26 and then patterned using a photolithography process to form the open portion O. Alternatively, light-blocking dyes may be inkjet-printed to directly pattern the light-blocking layer 28.

After the formation of the light-blocking layer 28, the second pixel defining layer 30 is formed on the light-blocking layer 28. The second pixel defining layer 30 may be formed in the same way as the first pixel defining layer 26 (operations S240 and 250). Next, the organic light-emitting layer is formed in the open portion O (operation S260).

In organic light-emitting displays and methods of manufacturing the same according to embodiments of the present invention, it is possible to minimize the degradation of an oxide semiconductor layer caused by internal light which is emitted from a light-emitting layer or external light. Therefore, the elemental reliability of the oxide semiconductor layer can be improved.

While the present invention has been particularly shown and described with reference to embodiments thereof, it will be understood by those of ordinary skill in the art that various changes in form and detail may be made therein without departing from the spirit and scope of the present invention as defined by the following claims. The embodiments should be considered in a descriptive sense only and not for purposes of limitation.

What is claimed is:

1. A method of manufacturing an organic light-emitting display, the method comprising:
   providing a structure comprising a substrate having a pixel region and a transistor region, the structure further comprising a first electrode in the pixel region and a transistor in the transistor region;
   forming a pixel defining layer over the transistor region while exposing at least a portion of the first electrode;
   forming a light-blocking layer over at least part of the pixel defining layer; and
   forming an organic light-emitting layer over the exposed portion of the first electrode.

2. The method of claim 1, wherein the transistor comprises: a gate electrode, a gate insulator, a channel, a source and a drain, wherein the gate electrode is interposed between the gate insulator and the substrate, wherein the source is electrically connected to the first electrode.

3. A method of manufacturing an organic light-emitting display, the method comprising:
   providing a structure comprising a substrate having a pixel region and a transistor region, the structure further comprising a first electrode in the pixel region and a transistor in the transistor region;
   forming a pixel defining layer over the transistor region while exposing at least a portion of the first electrode;
   forming a light-blocking layer over at least part of the pixel defining layer; and
   forming an organic light-emitting layer over the exposed portion of the first electrode,
   wherein the transistor comprises: a gate electrode, a gate insulator, a channel, a source and a drain, wherein the gate electrode is interposed between the gate insulator and the substrate, wherein the source is electrically connected to the first electrode, and
   wherein providing the structure comprises:
   foaming a second electrode over the transistor region at the same level as the first electrode;
   forming the gate electrode over the second electrode;
   forming a semiconductor layer comprising an oxide over the gate electrode; and
   forming the channel, source and drain in the semiconductor layer.

4. The method of claim 1, wherein forming the pixel defining layer comprises:
   forming a layer of a material for the pixel defining layer over the first electrode and further over the transistor; and
   creating an opening in the layer of the material for the pixel defining layer to expose the portion of the first electrode.

5. The method of claim 1, wherein forming the pixel defining layer comprises exposing an open portion of the pixel defining layer to light and developing the open portion.

6. The method of claim 1, wherein forming the light-blocking layer comprises forming an opening of the light-blocking layer disposed over the first transparent electrode such that a boundary of the opening of the light-blocking layer is situated further away from a center of an opening of the pixel defining layer compared to a boundary of an opening of the pixel defining layer.

7. The method of claim 1, wherein the pixel defining layer is made of one or more materials selected from the group consisting of a photosensitive polyimide material, an acrylic material, a siloxane material, and a novolac material.

8. The method of claim 1, wherein the light-blocking layer comprises a material with a dielectric constant of about 3.0 or less.

9. The method of claim 1, wherein the light-blocking layer comprises a black material.

10. The method of claim 1, wherein the light-blocking layer is configured to block light in a wavelength range of about 350 nm to about 450 nm.

11. The method of claim 1, wherein in the forming of the light-blocking layer, a light-blocking material is inkjet-printed over a predetermined region of the substrate.

12. The method of claim 1, wherein the transistor comprises an oxide semiconductor material.

13. A method of manufacturing an organic light-emitting display, the method comprising:
   providing a structure comprising a substrate having a pixel region and a transistor region, the structure further comprising a first electrode in the pixel region and a transistor in the transistor region;
   forming a first pixel defining layer over the transistor region while exposing at least a portion of the first electrode;
   forming a light-blocking layer over at least part of the first pixel defining layer;
   forming a second pixel defining layer over at least part of the light-blocking layer while exposing the at least a portion of the first electrode; and
   forming an organic light-emitting layer over at least part of the exposed portion of the first electrode.

14. The method of claim 13, wherein the transistor comprises: a gate electrode, a gate insulator, a channel, a source and a drain, wherein the gate electrode is interposed between the gate insulator and the substrate, wherein the source is electrically connected to the first electrode.

15. The method of claim 14, wherein providing the structure comprises:
   forming a second electrode over the transistor region at the same level as the first electrode;
   forming the gate electrode over the second electrode;
   forming a semiconductor layer comprising an oxide over the gate electrode; and
   forming the channel, source and drain in the semiconductor layer.

16. The method of claim 13, wherein forming the first pixel defining layer comprises:
  forming a layer of a material for the first pixel defining layer over the first electrode and further over the transistor; and
  creating an opening in the layer of the material for the first pixel defining layer to expose the at least a portion of the first electrode.

17. The method of claim 13, wherein the forming the first pixel defining layer of exposing an open portion of the first pixel defining layer to light and developing the open portion.

18. The method of claim 13, wherein in the forming the light-blocking layer comprises inkjet-printing a light-blocking material over a predetermined region of the substrate.

19. The method of claim 13, wherein the first and second pixel defining layers comprise one or more materials selected from the group consisting of a photosensitive polyimide material, an acrylic material, a siloxane material, and a novolac material.

20. The method of claim 19, wherein the first and second pixel defining layers comprise the same material.

21. The method of claim 13, wherein the transistor comprises an oxide semiconductor material.

* * * * *